(12) United States Patent
Kitazawa et al.

(10) Patent No.: US 12,391,860 B2
(45) Date of Patent: Aug. 19, 2025

(54) THERMAL-CONDUCTIVE SILICONE COMPOSITION

(71) Applicant: SHIN-ETSU CHEMICAL CO., LTD., Tokyo (JP)

(72) Inventors: Keita Kitazawa, Annaka (JP); Wataru Toya, Annaka (JP); Ayako Yamaguchi, Toyota (JP); Koji Nakanishi, Kounan (JP); Ryo Miyazaki, Toyota (JP); Masataka Deguchi, Nagoya (JP)

(73) Assignee: SHIN-ETSU CHEMICAL CO., LTD., Tokyo (JP)

( * ) Notice: Subject to any disclaimer, the term of this patent is extended or adjusted under 35 U.S.C. 154(b) by 734 days.

(21) Appl. No.: 17/786,665

(22) PCT Filed: Sep. 30, 2020

(86) PCT No.: PCT/JP2020/037190
§ 371 (c)(1),
(2) Date: Jun. 17, 2022

(87) PCT Pub. No.: WO2021/131212
PCT Pub. Date: Jul. 1, 2021

(65) Prior Publication Data
US 2023/0053865 A1   Feb. 23, 2023

(30) Foreign Application Priority Data

Dec. 23, 2019  (JP) ................... 2019-231199

(51) Int. Cl.
C09K 5/14         (2006.01)
(52) U.S. Cl.
CPC ..................... C09K 5/14 (2013.01)
(58) Field of Classification Search
CPC ........................................ C09K 5/14
See application file for complete search history.

(56) References Cited

U.S. PATENT DOCUMENTS

| | | | | |
|---|---|---|---|---|
| 11,912,869 B2 * | 2/2024 | Kitazawa | ............... | C08G 77/18 |
| 12,180,368 B2 * | 12/2024 | Toya | ............ | C09K 5/14 |
| 12,221,543 B2 * | 2/2025 | Yamada | ............... | C08G 77/20 |
| 12,258,496 B2 * | 3/2025 | Yamazaki | ............... | C09J 183/04 |
| 2003/0049466 A1 | 3/2003 | Yamada et al. | | |
| 2003/0180484 A1 * | 9/2003 | Imai | ............ | H01L 23/3737 |
| | | | | 428/34.1 |
| 2007/0149834 A1 | 6/2007 | Endo et al. | | |
| 2008/0213578 A1 | 9/2008 | Endo et al. | | |
| 2008/0254247 A1 | 10/2008 | Asaine | | |
| 2011/0024675 A1 | 2/2011 | Endo et al. | | |
| 2011/0248211 A1 | 10/2011 | Matsumoto et al. | | |
| 2012/0133072 A1 * | 5/2012 | Bunyan | ............... | C08L 83/04 |
| | | | | 264/261 |
| 2015/0122422 A1 | 5/2015 | Hayasaka et al. | | |
| 2015/0148273 A1 | 5/2015 | Matsumoto et al. | | |
| 2015/0315437 A1 * | 11/2015 | Albaugh | ............... | C08K 5/56 |
| | | | | 252/514 |
| 2016/0208156 A1 | 7/2016 | Kitazawa et al. | | |
| 2017/0081578 A1 | 3/2017 | Kato et al. | | |
| 2018/0161266 A1 * | 6/2018 | Bruni | ............... | A61K 8/06 |
| 2019/0002694 A1 * | 1/2019 | Akiba | ............... | H01L 23/3737 |
| 2019/0355885 A1 | 11/2019 | Nishi et al. | | |
| 2020/0056042 A1 * | 2/2020 | Inagaki | ............... | C08L 83/04 |
| 2021/0147681 A1 | 5/2021 | Hirakawa et al. | | |
| 2022/0235181 A1 * | 7/2022 | Amako | ............... | C08G 77/44 |
| 2022/0235226 A1 * | 7/2022 | Amako | ............... | C09D 7/61 |
| 2023/0124814 A1 * | 4/2023 | Toya | ............... | C08L 83/04 |
| | | | | 252/75 |

FOREIGN PATENT DOCUMENTS

| | | |
|---|---|---|
| CN | 104245848 A | 12/2014 |
| CN | 105555874 A | 5/2016 |
| EP | 3 489 305 A1 | 5/2019 |
| JP | 2938428 B1 | 8/1999 |
| JP | 2938429 B1 | 8/1999 |
| JP | 2002-188010 A | 7/2002 |

(Continued)

OTHER PUBLICATIONS

Dec. 15, 2020 International Search Report issued in International Patent Application No. PCT/JP2020/037190.
Jun. 28, 2022 International Preliminary Report on Patentability issued in International Patent Application No. PCT/JP2020/037190.
Jun. 6, 2024 Extended Search Report issued in European Patent Application No. 20905400.6.
Dec. 15, 2023 Search Report issued in Chinese Patent Application No. 202080089488.3.
Search Report issued Feb. 20, 2024, in Taiwanese Patent Application No. 109135419.

Primary Examiner — Jane L Stanley
(74) Attorney, Agent, or Firm — Oliff PLC

(57) ABSTRACT

A thermal-conductive silicone composition containing (A) 0.5 to 2.5 mass % of a crosslinked silicone gel containing (a) an organopolysiloxane having at least two aliphatic unsaturated hydrocarbon groups per molecule, and having a kinematic viscosity at 25° C. of 10,000,000 mm$^2$/s or more, and (b) an organohydrogenpolysiloxane having two or more silicon-bonded hydrogen atoms per molecule; (B) 12.5 to 19.5 mass % of a hydrolysable organopolysiloxane compound; and (C) 80 to 85 mass % of aluminum nitride particles having an average particle size of 0.5 pm or more and 1.5 pm or less. A content of coarse particles in the aluminum nitride particles is 1.0 volume % or less relative to the whole. The coarse particles are 10 pm or more in a particle size distribution by laser diffraction. A thermal-conductive silicone composition has excellent coating workability and favorable pumping-out resistance, and is capable of attaining low thermal resistance by being thinly compressed.

8 Claims, No Drawings

(56) References Cited

FOREIGN PATENT DOCUMENTS

| | | |
|---|---|---|
| JP | 3580366 B2 | 10/2004 |
| JP | 3952184 B2 | 8/2007 |
| JP | 2008-260798 A | 10/2008 |
| JP | 2009-209165 A | 9/2009 |
| JP | 4572243 B2 | 11/2010 |
| JP | 4656340 B2 | 3/2011 |
| JP | 4913874 B2 | 4/2012 |
| JP | 4917380 B2 | 4/2012 |
| JP | 4933094 B2 | 5/2012 |
| JP | 5365572 B2 | 12/2013 |
| JP | 2014-080546 A | 5/2014 |
| JP | 2015-090897 A | 5/2015 |
| JP | 2017-226724 A | 12/2017 |
| JP | 2018-178010 A | 11/2018 |
| TW | 200825138 A | 6/2008 |
| TW | 201821586 A | 6/2018 |
| WO | 2015/155948 A1 | 10/2015 |
| WO | 2018/016566 A1 | 1/2018 |
| WO | 2018/173945 A1 | 9/2018 |

* cited by examiner

THERMAL-CONDUCTIVE SILICONE COMPOSITION

TECHNICAL FIELD

The present invention relates to a thermal-conductive silicone composition.

BACKGROUND ART

It is widely known that electronic parts such as LSIs and IC chips generate heat in use, thereby lowering the performances thereof. As means for solving this problem, various heat-dissipating techniques have been used. Typical heat-dissipating techniques include a technique involving disposing a cooling member near a heat-generating part and bringing them into close contact to efficiently remove and dissipate heat thorough the cooling member.

In this event, if there is a space between the heat-generating member and the cooling member, thermal conduction is lowered because of the presence of air, which is poor in thermal conductivity, so that the temperature of the heat-generating member cannot be reduced sufficiently. To prevent the presence of such air and enhance thermal conductivity, heat-dissipating materials having good thermal conductivity and followability to the surface of the member have been conventionally used, such as heat-dissipating greases and heat-dissipating sheets (Patent Documents 1 to 11).

For example, Patent Document 9 discloses a thermal-conductive silicone grease composition containing an organopolysiloxane having a particular structure, an alkoxysilane having particular substituents, and a thermal-conductive filler. It is stated that the composition has favorable thermal conductivity, favorable flowability, and excellent workability. Moreover, Patent Documents 10 and 11 disclose sheets having adhesion property and thermal conductivity, and also disclose thermal conductive compositions in each of which an addition-curable silicone rubber composition is blended with a thermal-conductive filler and a silicone resin having no aliphatic unsaturated hydrocarbon group. Patent Documents 10 and 11 disclose that thermal-conductive cured products can be provided which have appropriate adhesion property and favorable thermal conductivity in thin-film form.

As actual measures against heat of semiconductor packages including LSIs, IC chips, etc., heat-dissipating greases thinly compressible and capable of attaining low thermal-resistance are suitable from the viewpoint of heat-dissipating performance. Heat-dissipating greases can be roughly classified into two: "curable type" which can be cured after compression to desired thickness; and "non-curable type" which keeps grease state without being cured.

"Curable" heat-dissipating greases cured after compression to desired thicknesses makes the occurrence of the flow out (pump out) hardly, the flow out being caused due to expansion and contraction according to a thermal history in which heat generation and cooling of a heat-generating part repeat. This enables the reliability of semiconductor packages to increase.

Contrarily, "curable" heat-dissipating greases have practically adverse features.

For example, many addition-curable heat-dissipating greases have been proposed in the past as thermal countermeasures for semiconductor packages (e.g., Patent Document 12). However, most of these have poor storability at room temperature and essentially require freezing or refrigeration for storage, making the product control difficult in some cases. Moreover, when the greases is cured, heating for a certain period is required. This makes the process complicated and longer, resulting in lower productivity. Further, from the viewpoint of environmental load attributable to the heating step also, it cannot be said that addition-curable heat-dissipating greases are preferable.

Additionally, condensation-curable heat-dissipating grease is also one of "curable type" (e.g., Patent Document 13). Since such condensation-curable heat-dissipating greases are thickened and cured by the moisture in air, preventing moisture allows the transportation and storage at room temperature, and relatively facilitates the product control. Condensation-curable heat-dissipating greases have such an advantage that the curing reaction can proceed without requiring a heating step if a certain amount of moisture is present. Nevertheless, there are large problems to be solved, such as odor and contamination of electronic parts with low-boiling-point components that are separated during the curing reaction.

Meanwhile, "non-curable" heat-dissipating greases have such features that these are easy to handle, for example, the transportation and storage at room temperature are generally possible. Nevertheless, there is a problem that pumping out mentioned above is likely to occur. As a measure to reduce the pumping out of "non-curable" heat-dissipating greases, it is effective to increase the viscosity of the greases. In exchange, this brings about a problem of lowered coating workability.

As described above, it is preferable to use "curable" heat-dissipating greases so as to enhance the reliability of semiconductor packages. However, from the viewpoints of imposing environmental load, and requiring strict temperature control and complicated curing process, it is hard to say that "curable" heat-dissipating greases are preferable.

Meanwhile, "non-curable" heat-dissipating greases are easy to handle and cause less environmental load, but pumping out is likely to happen. To guarantee the reliability of semiconductor packages, the viscosity needs to be increased, but consequently this causes a problem that the coating workability is sacrificed.

Moreover, in order to attain low thermal resistance by thinly compressing the greases, the particle size distribution of a thermal-conductive filler needs to be precisely controlled.

CITATION LIST

Patent Literature

Patent Document 1: JP 2938428 B
Patent Document 2: JP 2938429 B
Patent Document 3: JP 3580366 B
Patent Document 4: JP 3952184 B
Patent Document 5: JP 4572243 B
Patent Document 6: JP 4656340 B
Patent Document 7: JP 4913874 B
Patent Document 8: JP 4917380 B
Patent Document 9: JP 4933094 B
Patent Document 10: JP 2008-260798 A
Patent Document 11: JP 2009-209165 A
Patent Document 12: JP 2014-080546 A
Patent Document 13: JP 5365572 B

SUMMARY OF INVENTION

Technical Problem

The present invention has been made in view of the above-described circumstances. An object of the present invention is to provide a thermal-conductive silicone composition which has excellent coating workability and also favorable pumping-out resistance, and which is capable of attaining low thermal-resistance by being thinly compressed.

Solution to Problem

To achieve the object, the present invention provides a thermal-conductive silicone composition comprising:
(A) a crosslinked silicone gel comprising the following component (a) and component (b), wherein the component (A) is contained in an amount of 0.5 to 2.5 mass % relative to a total amount of the composition,
 (a) an organopolysiloxane having at least two aliphatic unsaturated hydrocarbon groups per molecule, and having a kinematic viscosity at 25° C. of 10,000,000 nm²/s or more, and
 (b) an organohydrogenpolysiloxane having two or more silicon-bonded hydrogen atoms per molecule in such an amount that a ratio of the number of the SiH groups to a total number of the aliphatic unsaturated hydrocarbon groups in the component (a) ranges from 1 to 3;
(B) a hydrolysable organopolysiloxane compound shown by the following general formula (1) and contained in an amount of 12.5 to 19.5 mass % relative to the total amount of the composition,

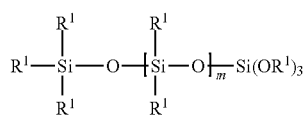

(1)

wherein R¹'s are identical to or different from one another, and each represent a monovalent hydrocarbon group having 1 to 10 carbon atoms but having no aliphatic unsaturated bond and optionally having a substituent, and "m" represents an integer of 5 to 100; and
 (C) aluminum nitride particles having an average particle size of 0.5 pm or more and 1.5 pm or less and contained in an amount of 80 to 85 mass % relative to the total amount of the composition, wherein a content of coarse particles in the aluminum nitride particles is 1.0 volume % or less relative to the entire aluminum nitride particles, the coarse particles having particle sizes of 10 pm or more in a particle size distribution by laser diffraction.

The inventive thermal-conductive silicone composition can have both of excellent coating workability and excellent pumping-out resistance. Further, the inventive thermal-conductive silicone composition can be thinly compressed to attain low thermal-resistance, and thereby improving the reliability of the electronic part to be mounted. Moreover, the inventive thermal-conductive silicone composition may be a "non-curable" heat-dissipating grease containing a large amount of the thermal-conductive filler. Meanwhile, the inventive thermal-conductive silicone composition keeps the viscosity appropriately, and can be a "non-curable" heat-dissipating grease which has both of excellent coating workability and excellent pumping-out resistance. Further, the inventive thermal-conductive silicone composition is capable of being transported and stored at room temperature, which allows easy handling.

In this case, "m" in the general formula (1) of the hydrolysable organopolysiloxane compound is preferably in a range from 10 to 60. Such a thermal-conductive silicone composition can have both of more excellent coating workability and more excellent pumping-out resistance.

Further, in the present invention, the aluminum nitride particles preferably have an oxygen content of 1.0 mass % or less. Such a thermal-conductive silicone composition surely has excellent thermal conductivity.

Moreover, the inventive thermal-conductive silicone composition has an absolute viscosity of preferably 500 Pa·S or less at 25° C. Such a thermal-conductive silicone composition can exhibit more excellent coating workability.

Advantageous Effects of Invention

As described above, the inventive thermal-conductive silicone composition can have both of excellent coating workability and excellent pumping-out resistance, and can be thinly compressed to attain low thermal resistance. In other words, according to the present invention, there can be provided a thermal-conductive silicone composition adaptable to recent increases in heat generation, size, and structural complexity of semiconductor devices. Moreover, the inventive thermal-conductive silicone composition can be a "non-curable" heat-dissipating grease containing a large amount of thermal-conductive filler but maintains appropriate viscosity, so that both excellent coating workability and excellent pumping-out resistance can be achieved. Further, the inventive thermal-conductive silicone composition is capable of being transported and stored at room temperature, which allows easy handling.

DESCRIPTION OF EMBODIMENTS

As noted above, there have been demands for the development of a thermal conductive silicone composition which is a "non-curable" heat-dissipating grease containing a large amount of thermal-conductive filler, but which has excellent coating workability and also favorable pumping-out resistance by maintaining suitable viscosity, and which is capable of attaining low thermal resistance by being thinly compressed.

The present inventors have earnestly studied to achieve the above object and consequently found that when a crosslinked silicone gel containing specific components and a hydrolysable organosilane compound are blended with one another in particular ratio, and then aluminum nitride particles with the controlled particle size distribution are blended in particular ratio, a thermal conductive silicone composition is obtained which can have excellent coating workability and also favorable pumping-out resistance by maintaining appropriate viscosity, and which can be thinly compressed to attain low thermal resistance. This finding has led to the completion of the present invention.

Specifically, the present invention is a thermal-conductive silicone composition comprising:
(A) a crosslinked silicone gel comprising the following component (a) and component (b), wherein the component (A) is contained in an amount of 0.5 to 2.5 mass % relative to a total amount of the composition,
 (a) an organopolysiloxane having at least two aliphatic unsaturated hydrocarbon groups per molecule, and having a kinematic viscosity at 25° C. of 10,000,000 nm²/s or more, and
 (b) an organohydrogenpolysiloxane having two or more silicon-bonded hydrogen atoms per molecule in such an amount that a ratio of the number of the SiH groups to a total number of the aliphatic unsaturated hydrocarbon groups in the component (a) ranges from 1 to 3;

(B) a hydrolysable organopolysiloxane compound shown by the following general formula (1) and contained in an amount of 12.5 to 19.5 mass % relative to the total amount of the composition,

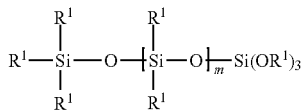

(1)

wherein $R^1$'s are identical to or different from one another, and each represent a monovalent hydrocarbon group having 1 to 10 carbon atoms but having no aliphatic unsaturated bond and optionally having a substituent, and "m" represents an integer of 5 to 100; and (C) aluminum nitride particles having an average particle size of 0.5 μm or more and 1.5 μm or less and contained in an amount of 80 to 85 mass % relative to the total amount of the composition, wherein a content of coarse particles in the aluminum nitride particles is 1.0 volume % or less relative to the entire aluminum nitride particles, the coarse particles having particle sizes of 10 μm or more in a particle size distribution by laser diffraction.

Hereinafter, the present invention will be described in detail, but the present invention is not limited thereto.

[Thermal-Conductive Silicone Composition]

The present invention relates to a thermal-conductive silicone composition which has a viscosity kept appropriately even with a large amount of thermal-conductive filler, and which has favorable reliability. The inventive thermal-conductive silicone composition can be a "non-curable" heat-dissipating grease.

The inventive thermal-conductive silicone composition is characterized by containing (A) a crosslinked silicone gel, (B) a hydrolysable organopolysiloxane compound, and (C) aluminum nitride particles. Thus, the above components (A) to (C) are the essential components of the inventive thermal-conductive silicone composition.

Hereinbelow, the aforementioned components (A) to (C) and other optional components will be described in detail.

Component (A)

The component (A) is a crosslinked silicone gel and obtained through a hydrosilylation reaction between the following component (a) and component (b):

(a) an organopolysiloxane having at least two aliphatic unsaturated hydrocarbon groups per molecule, and having a kinematic viscosity at 25° C. of 10,000,000 mm²/s or more, and (b) an organohydrogenpolysiloxane having two or more silicon-bonded hydrogen atoms per molecule in such an amount that a ratio of the number of the SiH groups to a total number of the aliphatic unsaturated hydrocarbon groups in the component (a) ranges from 1 to 3.

The component (a) is an organopolysiloxane having at least two aliphatic unsaturated hydrocarbon groups in a molecule, and having a kinematic viscosity of 10,000,000 nm²/s or more at 25° C.

The molecular structure thereof is not particularly limited, and examples thereof include linear structure, branched structure, linear structure having partially branched or cyclic structure, etc. Particularly preferable is a linear structure in which the main chain is composed of diorganosiloxane repeating units and both terminals of the molecular chain are blocked with triorganosiloxy groups. Organopolysiloxane having this linear structure may partially have a branched or cyclic structure.

The upper limit of the number of the aliphatic unsaturated hydrocarbon groups in the component (a) is not particularly limited. For example, the component (a) may contain two or more and 100 or less aliphatic unsaturated hydrocarbon groups per molecule.

The kinematic viscosity of the component (a) at 25° C. is 10,000,000 nm²/s or more, and preferably 15,000,000 mm²/s or more. If the kinematic viscosity is less than 10,000,000 rm²/s, pumping out may occur due to expansion and contraction according to a thermal history in which heat generation and cooling of a heat-generating part repeat. The upper limit of the kinematic viscosity of the component (a) is not particularly limited, and for example, is 50,000,000 mm²/s or less at 25° C.

Since it is difficult to directly measure the kinematic viscosity $\eta_A$ (25° C.) of the component (a) in the present invention, the kinematic viscosity qA of the component (a) is determined according to the following flow.

A solution of the component (a) in toluene at 1.0 g/100 mL is prepared to determine the specific viscosity ηsp (25° C.) according to the following formula. Here, n represents the viscosity of the solution in toluene, and n0 represents the viscosity of toluene.

$$\eta sp = (\eta/\eta 0) - 1$$

ηsp is substituted into the following equation (Huggins equation) to determine the intrinsic viscosity [η]. Here, K' represents Huggins constant.

$$\eta sp = [\eta] + K'[\eta]^2$$

[η] is substituted into the following equation (A. Kolorlov equation) to determine the molecular weight M.

$$[\eta] = 2.15 \times 10^{-4} M^{0.65}$$

M is substituted into the following equation (A. J. Barry equation) to determine the kinematic viscosity nA of the component (b).

$$\log \eta_A = 1.00 + 0.0123 M^{0.5}$$

The component (b) is an organohydrogenpolysiloxane having two or more, particularly preferably 3 to 100, further preferably 5 to 20 silicon-bonded hydrogen atoms (SiH groups) per molecule. The organohydrogenpolysiloxane may be any materials so long as the SiH groups in the molecule are subjected to the hydrosilylation reaction with the aliphatic unsaturated hydrocarbon groups contained in the above-mentioned component (a) in the presence of, for example, platinum group metal catalyst to form a crosslinked structure.

The molecular structure of the organohydrogenpolysiloxane is not particularly limited so long as the organohydrogenpolysiloxane has the above-mentioned properties, and examples of the molecular structure include linear structure, branched structure, cyclic structure, linear structure partially having branched or cyclic structure, etc. Preferable one is linear or cyclic structure.

The organohydrogenpolysiloxane has a kinematic viscosity at 25° C. of preferably 1 to 1,000 mm²/s, more preferably 10 to 100 nm²/s. When the kinematic viscosity is 1 mm²/s or more, there is no fear that physical properties of the silicone composition are lowered. When it is 1,000 mm²/s or less, there is no fear that the spreadability of the silicone composition becomes poor.

One kind of the organohydrogenpolysiloxane may be used solely, or a combination of two or more kinds thereof may be used.

The organohydrogenpolysiloxane of the component (b) is blended in such an amount that the ratio of the number of the SiH groups in the component (b) to the total number of the aliphatic unsaturated hydrocarbon groups in the component (a) ranges from 1 to 3, preferably 1.5 to 2.5. If the amount of the component (b) results in less than the lower limit, the addition reaction does not proceed sufficiently, and thus the crosslinking is insufficient. Moreover, if the amount of the component (b) is more than the upper limit, the crosslinked structure is not uniform in some case.

To accelerate the hydrosilylation reaction, for example, a conventionally known platinum group metal catalyst can be used. Examples thereof include platinum-based, palladium-based, and rhodium-based catalysts.

Among them, platinum or a platinum compound is preferred because of relatively high availability. For example, simple platinum, platinum black, chloroplatinic acid, platinum-olefin complexes, platinum-alcohol complexes, platinum coordination compounds, and so forth may be mentioned. One kind of the platinum group metal catalyst may be used solely, or two or more kinds thereof may be used in combination.

The blend amount of the platinum group metal catalyst may be an effective amount as the catalyst that is required to accelerate the reaction to obtain the crosslinked silicone gel of the component (A). The amount in terms of platinum group metal atoms is preferably 0.1 to 500 ppm, more preferably 1 to 200 ppm, on the basis of mass relative to the total mass of the components (a) and (b). The catalyst in the blend amount within the preferable ranges satisfactorily and economically achieves the effect as the catalyst.

Moreover, in obtaining the crosslinked silicone gel of the component (A) through the hydrosilylation reaction, a reaction control agent may be added to uniformly advance the reaction. As the reaction control agent, a conventionally known reaction control agent can be used. Examples thereof include acetylene compounds such as acetylene alcohols (e.g., ethynylmethyldecylcarbinol, 1-ethynyl-1-cyclohexanol and 3,5-dimethyl-1-hexyn-3-ol); various nitrogen compounds such as tributylamine, tetramethylethylenediamine, and benzotriazol; organophosphorus compounds such as triphenylphosphine; oxime compounds; organochlorine compounds; etc.

The reaction control agent may be blended in an amount of preferably 0.05 to 5%, more preferably 0.1 to 1%, relative to the total mass of the components (a) and (b). The reaction control agent in the blend amount within the preferable ranges can carry on the hydrosilylation reaction more uniformly.

The reaction control agent may be diluted with organo(poly)siloxane, toluene, or the like to enhance the dispersibility in the silicone composition when used.

The component (A) is blended in an amount of 0.5 to 2.5 mass %, preferably 1 to 2 mass %, relative to the total amount of the composition. If the blend amount is less than 0.5 mass % or more than 2.5 mass %, excellent coating workability and pumping-out resistance cannot be achieved simultaneously; in addition, it becomes difficult to make the thermal-conductive silicone composition have a viscosity in an appropriate range.

Component (B)

The component (B) is a hydrolysable organopolysiloxane compound shown by the following general formula (1). The hydrolysable organopolysiloxane compound as the component (B) is used to treat the surface of the later-described component (C), that is, the thermal-conductive filler, and serves to assist high filling performance of the filler.

(1)

where $R^1$'s are identical to or different from one another, and each represent a monovalent hydrocarbon group having 1 to 10 carbon atoms but having no aliphatic unsaturated bond and optionally having a substituent, and "m" represents an integer of 5 to 100.

$R^1$ in the formula (1) is a monovalent hydrocarbon group which has 1 to 10 carbon atoms but has no aliphatic unsaturated bond and optionally has a substituent. Preferably, $R^1$ is a monovalent saturated aliphatic hydrocarbon group optionally having a substituent, or a monovalent aromatic hydrocarbon group optionally having a substituent. More preferably, $R^1$ is a monovalent saturated aliphatic hydrocarbon group which may have a substituent.

The monovalent saturated aliphatic hydrocarbon group optionally having a substituent has 1 to 10 carbon atoms, preferably 1 to 8 carbon atoms, further preferably 1 to 6 carbon atoms. Specific examples thereof include linear alkyl groups, such as a methyl group, ethyl group, propyl group, butyl group, pentyl group, hexyl group, heptyl group, and octyl group; branched alkyl groups, such as an isopropyl group, isobutyl group, tert-butyl group, isopentyl group, and neopentyl group; cycloalkyl groups, such as a cyclopentyl group, cyclohexyl group, and cycloheptyl group; halogen-substituted alkyl groups, such as a chloromethyl group, 3-chloropropyl group, 3,3,3-trifluoropropyl group, and bromopropyl group; etc.

The monovalent aromatic hydrocarbon group optionally having a substituent has 6 to 10 carbon atoms, preferably 6 to 8 carbon atoms, further preferably 6 carbon atoms. Specific examples thereof include aryl groups, such as a phenyl group and tolyl group; aralkyl groups, such as a benzyl group and 2-phenylethyl group; halogen-substituted aryl groups, such as an α,α,α-trifluorotolyl group and chlorobenzyl group; etc.

Among these, R1 is preferably a methyl group, an ethyl group, a 3,3,3-trifluoropropyl group, or a phenyl group, further preferably a methyl group, an ethyl group, or a phenyl group, particularly preferably a methyl group.

"m" is an integer of 5 to 100, preferably an integer of 5 to 80, further preferably an integer of 10 to 60. If the value of "m" is smaller than 5, oil bleeding from the silicone composition may become prominent, and the pumping-out resistance may lower. Meanwhile, if the value of "m" is larger than 100, the wettability to the filler becomes insufficient, so that the viscosity of the composition is increased, and the coating workability may degrade.

The component (B) is blended in an amount of 12.5 to 19.5 mass %, preferably 14 to 18 mass %, relative to the total amount of the composition. If the blend amount is less than 12.5 mass % or more than 19.5 mass %, excellent coating workability and pumping-out resistance cannot be achieved simultaneously; in addition, it becomes difficult to make the thermal-conductive silicone composition have a viscosity in an appropriate range.

Component (C)

The component (C) is aluminum nitride particles having an average particle size of 0.5 μm or more and 1.5 μm or less. A content of coarse particles in the aluminum nitride particles is 1.0 volume % or less relative to the entire aluminum nitride particles. The coarse particles have particle sizes of 10 μm or more in a particle size distribution by laser diffraction. The component (C) is blended as the thermal-conductive filler to provide thermal conductivity to the thermal-conductive silicone composition.

If the aluminum nitride particles have an average particle size exceeding 1.5 μm, the compressibility of the thermal-conductive silicone composition may be lowered, and the thermal conductivity may be lowered. Meanwhile, if the aluminum nitride particles have an average particle size of less than 0.5 μm, it becomes difficult to make the thermal-conductive silicone composition have a viscosity in an appropriate range.

The use of the aluminum nitride as the component (C) whose oxygen content is 1.0 mass % or less can further enhance the thermal conductivity of the resulting thermal-conductive silicone composition. The component (C) has an oxygen content of preferably 1.0 mass % or less, more preferably 0.5 mass % or less. The lower limit of the oxygen content of the component (C) is not particularly limited, and the oxygen content of the component (C) can be 0.01 mass % or more, for example.

Further, the compressibility and the thermal conductivity of the thermal-conductive silicone composition can be successfully enhanced by using the component (C) in which the content of coarse particles in the aluminum nitride is 1.0 volume % or less, the coarse particles having particle sizes of 10 μm or more. The lower limit of the content of the coarse particles is not particularly limited. The aluminum nitride which is the component (C) has a coarse particle content of 0.01 volume % or more, for example. Moreover, the upper limit of the particle sizes of the coarse particles is not particularly limited, and can be 1,000 μm or less, for example.

Note that the average particle size can be determined, for example, as an average value (or median diameter) based on volume in particle size distribution measurement by a laser beam diffraction method.

The component (C) is blended in an amount of 80 to 85 mass %, preferably 82 to 83 mass %, relative to a total amount of the composition. If the blend amount is more than 85 mass %, it becomes difficult to make the thermal-conductive silicone composition have a viscosity in an appropriate range. If the blend amount is less than 80 mass %, the thermal conductivity becomes poor.

Other Components

The inventive thermal-conductive silicone composition may contain a conventionally-known antioxidant, as necessary, such as 2,6-di-tert-butyl-4-methylphenol, to prevent deterioration of the composition. Further, a dye, a pigment, a flame retardant, a precipitation-inhibitor, a thixotropy-enhancer, or other additives can be blended as necessary.

Process for Producing Thermal-Conductive Silicone Composition

A method for producing the thermal-conductive silicone composition according to the present invention will be described. The production method of the inventive silicone-composition is not particularly limited. An example thereof include a method in which the components (A) to (C) are mixed together using, for example, a mixer, such as Trimix, Twinmix or Planetary Mixer (all registered trademarks for mixers manufactured by Inoue Manufacturing Co., Ltd.), Ultramixer (a registered trademark for a mixer manufactured by Mizuho Industrial Co., Ltd.), and a Hivis Disper Mix (a registered trademark for a mixer manufactured by PRIMIX Corporation).

Moreover, the components of the inventive thermal-conductive silicone composition may be mixed while being heated. The heating conditions are not particularly limited. The temperature is normally 25 to 220° C., preferably 40 to 200° C., particularly preferably 50 to 200° C. The time is normally 3 minutes to 24 hours, preferably 5 minutes to 12 hours, particularly preferably 10 minutes to 6 hours. Additionally, deaeration may be performed during the heating.

Note that as the crosslinked silicone gel which is the component (A), the aforementioned product prepared in advance through the hydrosilylation reaction between the components (a) and (b) can be used. Alternatively, the crosslinked silicone gel can also be prepared through the hydrosilylation reaction in the heating and mixing step(s) of forming the thermal-conductive silicone composition.

The inventive thermal-conductive silicone composition has an absolute viscosity of preferably 500 Pa·s or less, more preferably 200 to 400 Pa·s, measured at 25° C. With the absolute viscosity of 500 Pa·s or less, there is no fear that the coating workability is degraded.

Additionally, the inventive thermal-conductive silicone composition may have a thermal conductivity of normally 1.5 to 2.5 W/m·K.

Note that, in the present invention, the absolute viscosity of the thermal-conductive silicone composition is a value measured at 25° C. with a rotational viscometer, and the thermal conductivity is a value measured by hot disc method.

The above-described inventive thermal-conductive silicone composition can have both of excellent coating workability and excellent pumping-out resistance. Further, the thermal-conductive silicone composition can be thinly compressed to attain low thermal resistance, thereby improving the reliability of the electronic part to be mounted. Moreover, the inventive thermal-conductive silicone composition may be a "non-curable" heat-dissipating grease containing a large amount of the thermal-conductive filler. Meanwhile, the inventive thermal-conductive silicone composition can keep the viscosity appropriately to be a "non-curable" heat-dissipating grease which has both of excellent coating workability and excellent pumping-out resistance.

Further, the inventive thermal-conductive silicone composition is capable of being transported and stored at room temperature, which allows easy handling.

EXAMPLE

Hereinafter, the present invention will be described in more details by showing Examples and Comparative Examples, but the present invention is not limited to the following Examples. Note that the value of the kinematic viscosity of each component (A) was determined according to the above-described flow, and the values of the kinematic viscosity of the other components were measured at 25° C. with an Ubbelohde-type Ostwald viscometer.

[Production of Thermal-Conductive Silicone Compositions]

First, the following components were prepared to produce the inventive thermal-conductive silicone compositions.

Component (A)

A-1: a crosslinked silicone gel made from the following components (a-1) and (b-1), prepared through a hydrosilylation reaction in a heating and mixing step for preparing the later-described thermal-conductive silicone composition in such an amount that the ratio of the number of the SiH groups in the component (b-1) to the total number of the aliphatic unsaturated hydrocarbon groups in the component (a-1) was 2.5 a-1: a dimethylpolysiloxane having a kinematic viscosity at 25° C. of 15,000,000 mm$^2$/s in which both terminals were blocked with dimethylvinylsilyl groups b-1: a methyl-hydrogen-dimethyl-polysiloxane having a kinematic viscosity at 25° C. of 12 mm$^2$/s shown by the following formula (2)

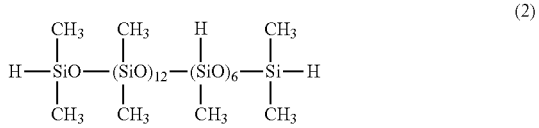

(2)

A-2: a crosslinked silicone gel made from the component (a-1) and the following component (b-2), prepared through a hydrosilylation reaction in a heating and mixing step for preparing the later-described thermal-conductive silicone composition in such an amount that the ratio of the number of the SiH groups in the component (b-2) to the total number of the aliphatic unsaturated hydrocarbon groups in the component (a-1) was 2.5 b-2: a methyl-hydrogen-dimethylpolysiloxane having a kinematic viscosity at 25° C. of 100 mm$^2$/s shown by the following formula (3)

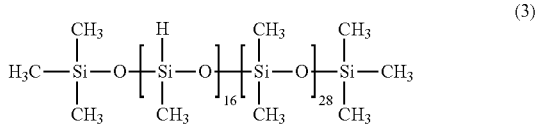

(3)

A-3: a crosslinked silicone gel made from the components (a-1) and (b-1), prepared through a hydrosilylation reaction in a heating and mixing step for preparing the later-described thermal-conductive silicone composition in such an amount that the ratio of the number of the SiH groups in the component (b-1) to the total number of the aliphatic unsaturated hydrocarbon groups in the component (a-1) was 2.0

A-4: a crosslinked silicone gel made from the components (a-1) and (b-1), prepared through a hydrosilylation reaction in a heating and mixing step for preparing the later-described thermal-conductive silicone composition in such an amount that the ratio of the number of the SiH groups in the component (b-1) to the total number of the aliphatic unsaturated hydrocarbon groups in the component (a-1) was 1.5

A-5: a crosslinked silicone gel made from the following component (a-2) and the component (b-1), prepared through a hydrosilylation reaction in a heating and mixing step for preparing the later-described thermal-conductive silicone composition in such an amount that the ratio of the number of the SiH groups in the component (b-1) to the total number of the aliphatic unsaturated hydrocarbon groups in the component (a-2) was 2.5 a-2: a dimethylpolysiloxane having a kinematic viscosity at 25° C. of 10,000,000 mm$^2$/s in which both terminals were blocked with dimethylvinylsilyl groups A-6 (for comparison): a crosslinked silicone gel made from the components (a-1) and (b-1), prepared through a hydrosilylation reaction in a heating and mixing step for preparing the later-described thermal-conductive silicone composition in such an amount that the ratio of the number of the SiH groups in the component (b-1) to the total number of the aliphatic unsaturated hydrocarbon groups in the component (a-2) was 0.8

A-7 (for comparison): a crosslinked silicone gel made from the following component (a-3) and the component (b-1), prepared through a hydrosilylation reaction in a heating and mixing step for preparing the later-described thermal-conductive silicone composition in such an amount that the ratio of the number of the SiH groups in the component (b-1) to the total number of the aliphatic unsaturated hydrocarbon groups in the component (a-2) was 2.0 a-3: a dimethylpolysiloxane having a kinematic viscosity at 25° C. of 100,000 mm$^2$/s in which both terminals were blocked with dimethylvinylsilyl groups A-8 (for comparison): a crosslinked silicone gel made from the components (a-1) and (b-2), prepared through a hydrosilylation reaction in a heating and mixing step for preparing the later-described thermal-conductive silicone composition in such an amount that the ratio of the number of the SiH groups in the component (b-2) to the total number of the aliphatic unsaturated hydrocarbon groups in the component (a-1) was 3.5

Component (B)

B-1: a dimethylpolysiloxane shown by the following formula (4) and having one terminal blocked with a trimethoxysilyl group

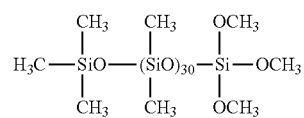

(4)

Component (C)

C-1: aluminum nitride particles having an average particle size of 1.0 μm and containing 0.1 volume % or less of coarse particles 10 μm or more in size C-2: aluminum nitride having an average particle size of 1.5 μm and containing 0.4 volume % or more of coarse particles 10 μm or more in size C-3 (for comparison): aluminum nitride having an average particle size of 1.5 μm and containing 5.0 volume % or more of coarse particles 10 μm or more in size Other Components D-1: a solution of a platinum-divinyltetramethyl-disiloxane complex dissolved in an organopolysiloxane having a kinematic viscosity at 25° C. of 600 mm$^2$/s in which both terminals are blocked with dimethylvinylsilyl groups (platinum atom content: 1% by mass as the platinum atom)

E-1: ethynylcyclohexanol (the following formula (5) )

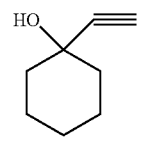

(5)

[Examples 1 to 7, Comparative Examples 1 to 6]

Production of Thermal-Conductive Silicone Compositions

The components (A) to (E) were blended according to the formulations shown in Tables 1 to 2 below by the following method to produce thermal-conductive silicone compositions.

Any one of the components (a-1), (a-2), and (a-3), the component (B), and any one of the components (C-1), (C-2), and (C-3) were introduced into 5-litter Planteary Mixer (manufactured by Inoue Manufacturing Co., Ltd.), and mixed under reduced pressure at 170° C. for 1 hour.

The mixture was cooled to be 40° C. or less. Next, the component (b-1) or (b-2) and the components (D) and (E) were added to the mixture and mixed at 170° C. for 1.5 hours to prepare thermal-conductive silicone compositions.

According to the following methods, each of the silicone compositions obtained by this method was measured for viscosity and thermal conductivity, and the pumping-out resistance was evaluated. Tables 1 and 2 show the results.

[Viscosity]

The absolute viscosity of each silicone composition was measured using a Malcolm viscometer (type: PC-1T) at 25° C. (at 10 rpm with Rotor-A, and at a shear rate of 6 [1/s]).

[Thermal Conductivity]

Each silicone composition was wrapped with kitchen wrap, and the thermal conductivity was measured with TPS-2500S manufactured by Kyoto Electronics Manufacturing Co., Ltd.

[Pumping-Out Resistance]

Each composition in an amount of 0.1 ml was sandwiched between glass plates, and compressed for 15 minutes using two clips with 1.8 kgf (17.65 N). The area of the composition in this event was designated as $\alpha$. The resultant was vertically placed in a thermal shock test chamber where −65° C./30 minutes and 150° C./30 minutes were repeated, and taken out after 500 cycles. The area at this point was designated as $\beta$, and a formula $\beta/\alpha$ was calculated. Moreover, an area (=Y) of a region with no composition within the area $\beta$ was quantified by image processing, and a formula $Y/\beta$ was calculated. Thus, evaluation was made such that the smaller the values of $\beta/\alpha$ and $Y/\beta$, the more excellent the pumping-out resistance.

[Compressibility]

Each silicone composition was sandwiched between silicon wafers with a diameter of 12.7 mm. After the pressurization at 4.1 MPa for 2 minutes with AUTOGRAPH AG-5KNZPLUS manufactured by SHIMADZU CORPORATION, the thickness was measured.

TABLE 1

| | | Example | | | | | | |
|---|---|---|---|---|---|---|---|---|
| | | 1 | 2 | 3 | 4 | 5 | 6 | 7 |
| Composition | A-1 (parts by mass) | 20 | | | | | 20 | |
| | A-2 (parts by mass) | | 20 | | | | | 20 |
| | A-3 (parts by mass) | | | 20 | | | | |
| | A-4 (parts by mass) | | | | 20 | | | |
| | A-5 (parts by mass) | | | | | 20 | | |
| | A-6 (parts by mass) | | | | | | | |
| | A-7 (parts by mass) | | | | | | | |
| | A-8 (parts by mass) | | | | | | | |
| | B-1 (parts by mass) | 180 | 180 | 180 | 180 | 180 | 180 | 180 |
| | C-1 (parts by mass) | 1000 | 1000 | 1000 | 1000 | 1000 | | |
| | C-2 (parts by mass) | | | | | | 1000 | 1000 |
| | C-3 (parts by mass) | | | | | | | |
| | D-1 (parts by mass) | 0.66 | 0.66 | 0.66 | 0.66 | 0.66 | 0.66 | 0.66 |
| | E-1 (parts by mass) | 0.24 | 0.24 | 0.24 | 0.24 | 0.24 | 0.24 | 0.24 |
| Evaluation Results | Viscosity(Pa · s) | 360 | 480 | 260 | 230 | 390 | 290 | 390 |
| | Thermal conductivity (W/m · K) | 1.9 | 2.0 | 1.9 | 2.0 | 1.9 | 2.1 | 2.1 |
| | Pumping-out resistance ($\beta \div \alpha$) | 1.3 | 1.2 | 1.4 | 1.4 | 1.2 | 1.3 | 1.3 |
| | Pumping-out resistance ($\gamma \div \beta$) | 0.02 | 0 | 0.03 | 0.04 | 0.04 | 0.03 | 0.01 |
| | Compressibility (μm) | 2 | 2 | 2 | 2 | 2 | 4 | 4 |

TABLE 2

| | | Comparative Example | | | | | |
|---|---|---|---|---|---|---|---|
| | | 1 | 2 | 3 | 4 | 5 | 6 |
| Composition | A-1 (parts by mass) | | | | 40 | 5 | 20 |
| | A-2 (parts by mass) | | | | | | |
| | A-3 (parts by mass) | | | | | | |
| | A-4 (parts by mass) | | | | | | |
| | A-5 (parts by mass) | | | | | | |
| | A-6 (parts by mass) | 20 | | | | | |
| | A-7 (parts by mass) | | 65 | | | | |
| | A-8 (parts by mass) | | | 20 | | | |
| | B-1 (parts by mass) | 180 | 135 | 180 | 160 | 195 | 180 |
| | C-1 (parts by mass) | 1000 | 1000 | 1000 | | | |
| | C-2 (parts by mass) | | | | 1000 | 700 | |
| | C-3 (parts by mass) | | | | | | 1000 |
| | D-1 (parts by mass) | 0.66 | 0.66 | 0.66 | 0.66 | 0.66 | 0.66 |
| | E-1 (parts by mass) | 0.24 | 0.24 | 0.24 | 0.24 | 0.24 | 0.24 |
| Evaluation Results | Viscosity(Pa · s) | 220 | 400 | Composition was not converted to past form | Composition was not converted to past form | 80 | 270 |
| | Thermal conductivity (W/m · K) | 2.0 | 1.9 | | | 1.5 | 2.1 |
| | Pumping-out resistance ($\beta \div \alpha$) | 2.3 | 2.0 | | | 3.1 | 1.3 |
| | Pumping-out resistance ($\gamma \div \beta$) | 0.10 | 0.21 | | | 0.33 | 0.03 |
| | Compressibility (μm) | 2 | 2 | | | 4 | 20 |

From the results in Tables 1 to 2, each of the silicone compositions of Examples 1 to 7 satisfying the requirements of the present invention had appropriate viscosity and also had small values of β/α and Y/β, which are indicators of pumping-out resistance. This clearly indicates that flowing-out (pumping out) of the silicone compositions due to expansion and contraction in the thermal history hardly occurs. Further, each of the silicone compositions of Examples 1 to 7 is thinly compressible and therefore capable of attaining low thermal resistance. In other words, the inventive silicone compositions are capable of achieving both excellent coating workability and excellent pumping-out resistance, being thinly compressed to attain low thermal resistance.

In contrast, in the component (A) of the silicone composition of Comparative Example 1, the ratio of the number of the SiH groups in the component (b-1) to the total number of the aliphatic unsaturated hydrocarbon groups in the component (a-1) was 0.8, which was less than 1. In the component (A) of the silicone composition of Comparative Example 1, the crosslinking did not sufficiently proceed. Conceivably because of that, the silicone composition of Comparative Example 1 had large values of β/α and Y/β, which are indicators of pumping-out resistance.

Moreover, the component (a-3) in the component (A) of the silicone composition of Comparative Example 2 had the kinematic viscosity at 25° C. of 100,000 nm$^2$/s, which was less than 10,000,000 mm$^2$/s. Additionally, the component (A) in the silicone composition of Comparative Example 2 was blended in an amount of more than 2.5 mass %, and the component (B) was blended in an amount of less than 12.5 mass %. Conceivably because of that, the silicone composition of Comparative Example 2 presumably had large values of β/α and y/s, which are indicators of pumping-out resistance.

In the component (A) of the silicone composition of Comparative Example 3, the ratio of the number of the SiH groups in the component (b-1) to the total number of the aliphatic unsaturated hydrocarbon groups in the component (a-1) was 3.5, which was more than 3.

Conceivably because of that, in the silicone composition of Comparative Example 3, the crosslinking did not uniformly proceed, and the silicone composition was not converted to paste form.

In the silicone composition of Comparative Example 4, the component (A) was blended in an amount of more than 2.5 mass %. Presumably because of that, the silicone composition of Comparative Example 4 was not converted to paste form.

In the silicone composition of Comparative Example 5, the component (B) was blended in an amount of more than 19.5 mass %, and the component (C) was blended in an amount of more than 85 mass %. As a result, the silicone composition of Comparative Example 5 did not show sufficient viscosity, and the thermal conductivity was lower than the thermal conductivity of Examples 1 to 7.

Further, the silicone composition of Comparative Example 5 had low pumping resistance as well.

In the component (C-3) used in the silicone composition of Comparative Example 6, coarse particles having a size of 10 μm or more was contained in an amount of 5.0 volume % or more. Because of that, the silicone composition of Comparative Example 6 had poorer compressibility than those of Examples 1 to 7.

In other words, the silicone compositions of Comparative Examples 1 to 6 did not have appropriate viscosity, had large values of β/α and Y/β, which are indicators of pumping-out resistance, were incapable of being thinly compressed, or had such multiple disadvantages. Hence, excellent coating workability, excellent pumping-out resistance, and capability of compression to thin state cannot be achieved simultaneously.

From the foregoing, the inventive thermal-conductive silicone compositions have excellent coating workability and also favorable pumping-out resistance by maintaining suitable viscosity, and are capable of attaining low thermal resistance by being thinly compressed. Moreover, the inventive thermal-conductive silicone compositions can be "non-curable" heat-dissipating grease containing a large amount of thermal-conductive filler. Further, the inventive thermal-conductive silicone compositions keep the viscosity appropriately to be "non-curable" heat-dissipating grease which achieves both of excellent coating workability and excellent pumping-out resistance. Thus, the present invention makes it possible to provide thermal-conductive silicone compositions that are adaptable to recent increases in generated heat, size, and structural complexity of semiconductor devices.

It should be noted that the present invention is not limited to the above-described embodiments. The embodiments are just examples, and any embodiments that substantially have the same feature and demonstrate the same functions and effects as those in the technical concept disclosed in claims of the present invention are included in the technical scope of the present invention.

The invention claimed is:

1. A thermal-conductive silicone composition comprising:
(A) a crosslinked silicone gel comprising the following component (a) and component (b), wherein the component (A) is contained in an amount of 0.5 to 2.5 mass % relative to a total amount of the composition,
(a) an organopolysiloxane having at least two aliphatic unsaturated hydrocarbon groups per molecule, and having a kinematic viscosity at 25° C. of 10,000,000 mm²/s or more, and
(b) an organohydrogenpolysiloxane having two or more silicon-bonded hydrogen atoms per molecule in such an amount that a ratio of the number of the SiH groups to a total number of the aliphatic unsaturated hydrocarbon groups in the component (a) ranges from 1 to 3;
(B) a hydrolysable organopolysiloxane compound shown by the following general formula (1) and contained in an amount of 12.5 to 19.5 mass % relative to the total amount of the composition,

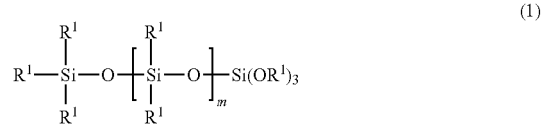

wherein $R^1$'s are identical to or different from one another, and each represent a monovalent hydrocarbon group having 1 to 10 carbon atoms but having no aliphatic unsaturated bond and optionally having a substituent, and "m" represents an integer of 5 to 100; and
(C) aluminum nitride particles having an average particle size of 0.5 μm or more and 1.5 μm or less and contained in an amount of 80 to 85 mass % relative to the total amount of the composition, wherein a content of coarse particles in the aluminum nitride particles is 1.0 volume % or less relative to the entire aluminum nitride particles, the coarse particles having particle sizes of 10 μm or more in a particle size distribution by laser diffraction.

2. The thermal-conductive silicone composition according to claim 1, wherein "m" in the general formula (1) of the hydrolysable organopolysiloxane compound is in a range from 10 to 60.

3. The thermal-conductive silicone composition according to claim 2, wherein the aluminum nitride particles have an oxygen content of 1.0 mass % or less.

4. The thermal-conductive silicone composition according to claim 3, wherein the thermal-conductive silicone composition has an absolute viscosity of 500 Pa·S or less at 25° C.

5. The thermal-conductive silicone composition according to claim 2, wherein the thermal-conductive silicone composition has an absolute viscosity of 500 Pa·S or less at 25° C.

6. The thermal-conductive silicone composition according to claim 1, wherein the aluminum nitride particles have an oxygen content of 1.0 mass % or less.

7. The thermal-conductive silicone composition according to claim 6, wherein the thermal-conductive silicone composition has an absolute viscosity of 500 Pa·S or less at 25° C.

8. The thermal-conductive silicone composition according to claim 1, wherein the thermal-conductive silicone composition has an absolute viscosity of 500 Pa·S or less at 25° C.

* * * * *